United States Patent [19]

Martin

[11] 4,162,818
[45] Jul. 31, 1979

[54] INTERCONNECTION FOR PLANAR ELECTRONIC CIRCUITS

[75] Inventor: Jacob H. Martin, Wellesley, Mass.

[73] Assignee: The United States of America as represented by the Secretary of the Air Force, Washington, D.C.

[21] Appl. No.: 865,268

[22] Filed: Dec. 28, 1977

[51] Int. Cl.² .................................... H01R 13/00
[52] U.S. Cl. ........................... 339/112 R; 339/17 M
[58] Field of Search ............ 339/112 R, 113 B, 17 M, 339/17 R, 17 CF

[56] References Cited

U.S. PATENT DOCUMENTS 4,045,105  8/1977  Lee et al. .................. 339/17 CF

*Primary Examiner*—Roy Lake
*Assistant Examiner*—DeWalden W. Jones
*Attorney, Agent, or Firm*—Joseph E. Rusz; Henry S. Miller

[57] ABSTRACT

A circuit board with connectors along more than one side designed to be stacked with similar boards, having a plurality of electrical contacts to connect to a connector header with resilient contacts, applying a force to the circuit board which is inclined from a central axis whereby the circuit board and the connector header join in a tight, reliable compression contact.

6 Claims, 3 Drawing Figures

INTERCONNECTION FOR PLANAR ELECTRONIC CIRCUITS

STATEMENT OF GOVERNMENT INTEREST

The invention described herein may be manufactured and used by or for the Government for governmental purposes without the payment of any royalty thereon.

BACKGROUND OF THE INVENTION

This invention relates generally to circuit boards for electronic circuits and more particularly to connectors for such circuit boards that may be used in a stacked configuration.

The development of the integrated circuit has greatly reduced the size of electronic circuits and their components. This reduction in size, however, must at some point become compatable with larger devices and systems which either cannot be reduced or won't be reduced beyond a certain point. For example, switches, dials and meters are limited to the point where human hands can operate and human eyes can see them.

The individual circuit that is commonly utilized today is of such small size that it is impractical to be repaired within the unit in which it functions. As a result, the circuits are placed on flat planar structures easily inserted or removed from the device. As a practical matter, connections for these circuits are brought to the edge of structure. They then connect to some type of connecting means which will carry the electrical signal or potential either to or away from the circuit. Packaging of the circuits controls the means and methods used to connect the circuits and structures on which they are mounted.

Present packaging trends are toward the use of large scale integrated circuits and dense interconnection of these circuits and other components using hybrid techniques. The resulting hybrid packages are characterized by high density "in-out" leads, often coming out all four sides of the circuit, and by high power densities. Frequently, it is desirable and necessary to inter-connect many of these hybrids in as small a volume as possible to save space and weight in aerospace equipment. In addition, requirements for short signal delays and for new technologies may also dictate that these components be packaged as close together as possible. These requirements for dense packaging put extreme pressure on the designer to reduce the volume required for interconnections between the circuit packages which in turn increases the system power density.

There has been a need seen for some method and means to provide a motherboard on more than one side of a stack of circuit structures. If such a solution included a motherboard on up to four sides of the circuit structure the packaging need would be met.

Several methods have been attempted in the past but have not proven entirely adequate, although providing some relief for the problem. Such methods include, stacked memory modules with riser ribbons, stacked printed circuit cards with compression connectors between layers, stacks of packages with leads on two or more sides interconnected with printed circuit cards, and permanently interconnected stacks of circuit cards. Other programs have been suggested with packages stacked with very precisely machined carriers and motherboard hardwear.

These systems have all failed to gain wide acceptance since they do not provide the characteristics necessary to make them small, reliable, strong, light weight and inexpensive. Further, such systems must provide easy access to all inter package signals for trouble shooting; must be easily disassemblable for replacement or repair of parts; provide for adequate thermal protection and able to accommodate discrete components such as inductors, transformers, and physically large capacitors where necessary.

SUMMARY OF THE INVENTION

In order to avoid the failures of systems, devices and methods of the past, a new system is herein proposed that makes provision for electrical connections and interconnections, heat transfer and structural integrity in a new and inventive way.

The invention provides an electronic circuit package or flat pack, mounted on a package carrier of aluminum or other suitable materials. A plurality of "in-out" leads are mounted along the perimeter of the circuit package and make contact with multiple connectors provided in header plates which abutt the package carrier on four sides. The package carrier is sloped at its junction with the connector header plate which is constructed of a good heat conducting material. The circuit conductors pass through the connector header and contact the "in-out" leads at the next level or system interconnection. Each multiple connector header holds a designed number of circuits and has provided therein further means for connection to the motherboard.

It is therefore an object of the invention to provide a new and improved system for the interconnection of planar electronic circuits.

It is another object of the invention to provide a new and improved system for the interconnection of planar electronic circuits that has improved means for connections and interconnections.

It is a further object of the invention to provide a new and improved system for the interconnection of planar electronic circuits that provides improved heat transfer characteristics.

It is still another object of the invention to provide a new and improved system for the interconnection of planar electronic circuits that has increased structural integrity over other known systems.

It is still a further object of the invention to provide a new and improved system for the interconnection of planar electronic circuits that is small in size and light in weight.

It is another object of the invention to provide a new and improved system for the interconnection of planar electronic circuits that provide increased reliability.

It is another object of the invention to provide a new and improved system for the interconnection of planar electronic circuits that may be easily disassembled for replacement or repair of parts.

These and other advantages, features and objects of the invention will become more apparent from the following description taken in connection with the illustrative embodiment in the accompanying drawing.

DESCRIPTION OF THE PREFERRED EMBODIMENT

Figure 1:
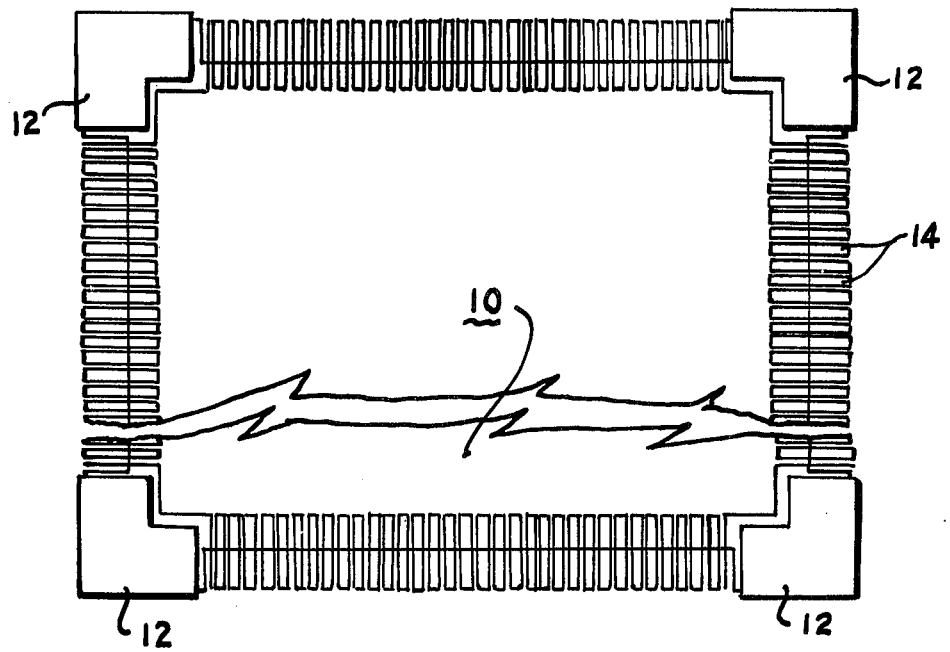
FIG. 1 is a top view of a flat pack, carrier and connector leader.

Referring now to FIG. 1, the circuit area of the structure is shown at 10. Circuit carriers 12 are mounted at each corner and provide a practical means for handling the structure. Connector leads 14 are positioned around the perimeter of the structure. The flat leads of the circuit may be used directly as part of the connector or they could be permanently attached (as could round leads) to other tabs which serve as part of the connector.

Figure 2:
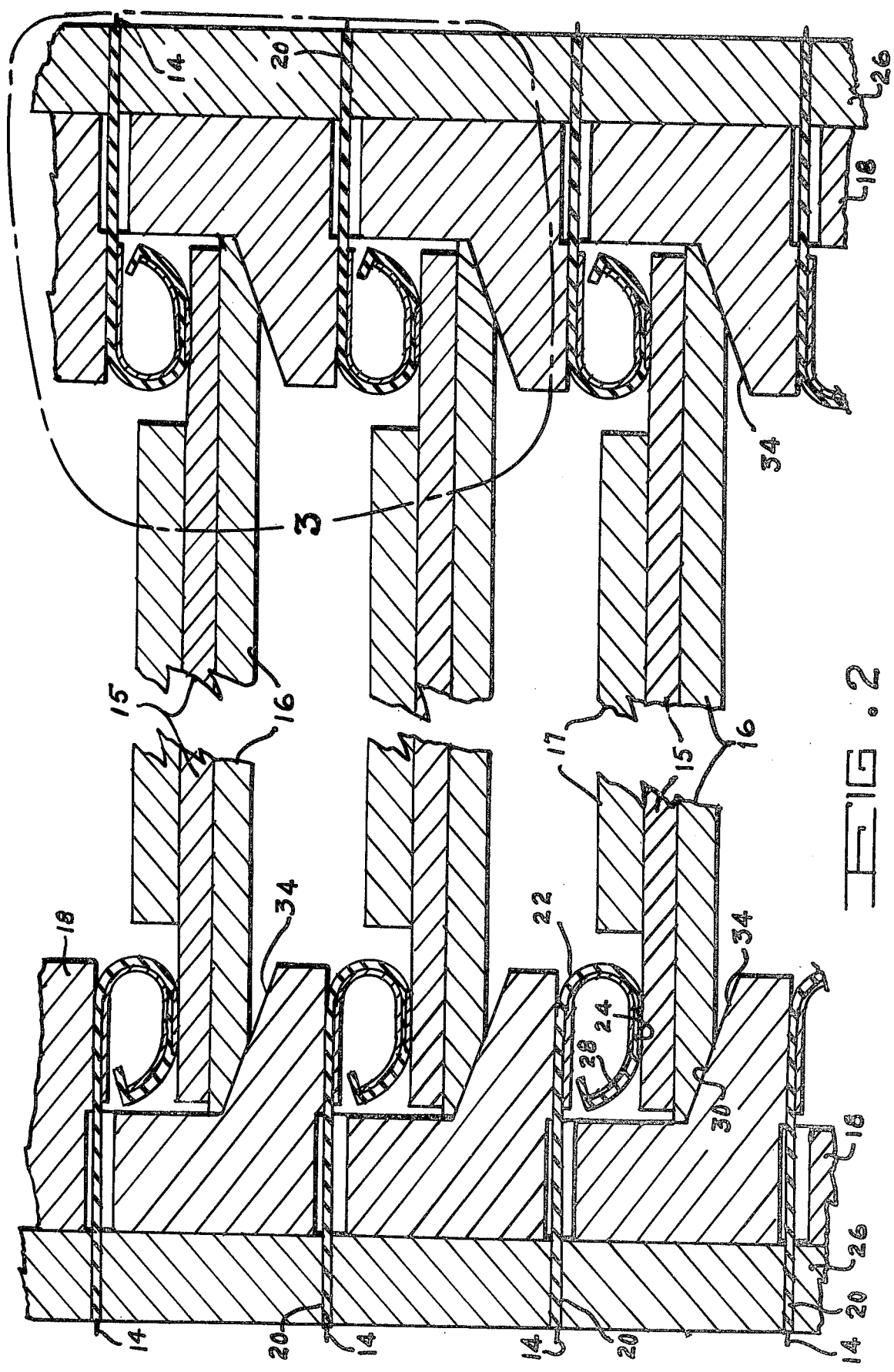
FIG. 2 is a crossectional view of an interconnected stack of planar circuits.

In FIG. 2 there is shown an interconnected stack of planar circuits. Each circuit 15 is connected into the aluminum multiple connector header 18 which secures the aluminum carrier 16. Each circuit is protected by a cover 17 which prevents physical damage from handling. Through the header is the flex print connector 20 which carries the signal via insulated (22) lead 24 to the interconnection board 26. Flat spring 28 presses against lead 24 to provide a good electrical connection as well as applying pressure to the inclined surfaces at 30-34 for good heat transfer. The system is so designed to be operational whether or not all circuit slots are occupied.

Figure 3:
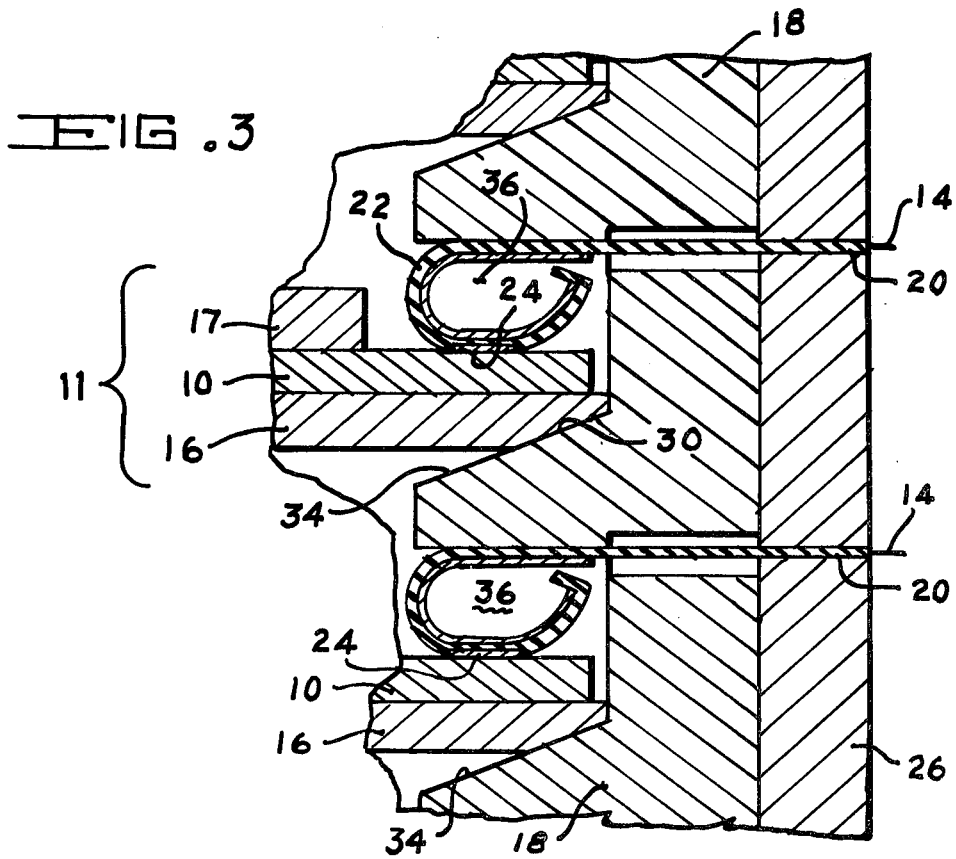
FIG. 3 is an enlarged, crossectional view of the connector assembly, shown in circle A in FIG. 2.

Concerning FIG. 3, demountable circuit package 11, includes circuit 10, mounted upon aluminum carrier 16, with protective cover 17. The package is shown bearing against inclined surface 34 of connector header 18. Connector lead 14 connects to flex-print connector 20 at interconnection board 26. The flex-print circuit forms an open loop 36 at one end which is spring biased by flat spring 28. Electrical insulation 22 is removed from the flex-print at 20 whereby the electrical conductor 24 is exposed to the circuit for electrical contact.

Heat transfer is accomplished from the circuit through the aluminum carrier plate 16. Inclined surfaces 30 and 34 of the carrier plate (16) and the aluminum connector header 18, transfer the heat away from the circuit and ultimately downward to an established heat transfer means (not shown).

Although the invention has been described with reference to a particular embodiment, it will be understood to those skilled in the art that the invention is capable of a variety of alternative embodiments within the spirit and scope of the appended claims.

What is claimed is:

1. A multiple circuit board packaging system for electronic devices comprising:
    at least one planar electronic circuit board, having a plurality of connecting leads radiating outwardly to the edge of the board on one side;
    a planar circuit board support means having high heat transfer qualities affixed to one side of the circuit board forming a package;
    protective means covering the circuit board on the side away from the support means;
    circuit board interconnecting means comprising at least two wall like members, each having a plurality of sequentially positioned angulated slots on one side for receiving a circuit board package and means for resiliently securing a circuit board in the slot while simultaneously making electrical contact with circuit connecting leads.

2. A circuit board packaging system according to claim 1 wherein the circuit board support means is angulated to mate with the angulated wall slot member.

3. A circuit board packaging system according to claim 2 wherein the angulated slot member has high heat transfer qualities.

4. A circuit board packaging system according to claim 3 wherein the wall like members include a plurality of apertures to allow electrical slot connectors to pass through.

5. A circuit board packaging system according to claim 4, including four wall like members.

6. A circuit board packaging system according to claim 1, wherein the circuit board package includes means on each corner for handling the circuit package.

* * * * *